(12) United States Patent
Watanabe

(10) Patent No.: US 6,771,003 B2
(45) Date of Patent: *Aug. 3, 2004

(54) SURFACE ACOUSTIC WAVE APPARATUS AND COMMUNICATION UNIT

(75) Inventor: Hiroki Watanabe, Ishikawa-ken (JP)

(73) Assignee: Murata Manufacturing Co., LTD, Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 10/052,370

(22) Filed: Jan. 23, 2002

(65) Prior Publication Data

US 2002/0135268 A1 Sep. 26, 2002

(30) Foreign Application Priority Data

Mar. 9, 2001 (JP) ........................................ 2001-067676

(51) Int. Cl.[7] ............................................... H03H 9/05
(52) U.S. Cl. .................................................. 310/313 B
(58) Field of Search ............. 310/313 A, 313 B–313 D, 310/313 R; 333/193–196

(56) References Cited

U.S. PATENT DOCUMENTS 5,838,089 A * 11/1998 Dreifus et al. .......... 310/313 R
6,351,196 B1 * 2/2002 Nakamura et al. .......... 333/195
6,388,545 B1 * 5/2002 Kawachi et al. ........ 310/313 B
6,597,262 B2 * 7/2003 Takamine ................ 310/313 B

FOREIGN PATENT DOCUMENTS

| EP | 0735671 | * | 3/1996 | ............ H03H/9/05 |
| EP | 0 735 671 | | 10/1996 | |
| EP | 0961404 | * | 5/1999 | ............ H03H/9/05 |
| EP | 0 961 404 | | 12/1999 | |
| EP | 1 168 612 | | 1/2002 | |
| EP | 1168612 A2 | * | 2/2002 | ............ H03H/9/64 |
| JP | 5-160664 | | 6/1993 | |
| JP | 06-097761 | | 4/1994 | |
| JP | 08-195645 | | 7/1996 | |
| JP | 11-26623 | | 1/1999 | |

* cited by examiner

Primary Examiner—Thomas M. Dougherty
Assistant Examiner—Karen Addison
(74) Attorney, Agent, or Firm—Keating & Bennett, LLP

(57) ABSTRACT

In a surface acoustic wave (SAW) apparatus, a substrate having a SAW device provided with a balun function mounted thereon is provided on a multi-layered bottom portion of a package. Electrical wiring patterns are disposed between an upper layer and a lower layer of the bottom portion such that a delay line, a reactance component, or a resistance component is added to at least one of the balanced signal terminals. Balanced signal external terminals to connect the SAW device to an external device are disposed symmetrically with respect to the center of the package.

20 Claims, 21 Drawing Sheets

SURFACE ACOUSTIC WAVE APPARATUS AND COMMUNICATION UNIT

BACKGROUND OF THE INVENTION

1. Field of the Invention

The present invention relates to a surface acoustic wave (SAW) apparatus having balanced signal terminals provided at least for an input side and an output side and, more particularly, to a SAW apparatus having a balanced-to-unbalanced conversion function, and also relates to a communication unit including the above-described SAW apparatus.

2. Description of the Related Art

There has been significant technological progress in decreasing the size and the weight of communication apparatuses, such as cellular telephones. This progress has been achieved by reducing the number and the size of the individual components of cellular telephones. As the frequency used in cellular telephones increases to, for example, a GHz band, SAW apparatuses are important because the sizes of the individual components of the SAW apparatuses can be reduced.

Some SAW apparatuses require impedance matching devices, such as phase shifters, at the input/output terminals. Cited reference 1 (Japanese Unexamined Patent Application Publication No. 8-195645: Device-Mounting Package) discloses the following type of SAW apparatus. An impedance matching device is provided on a matching circuit substrate, and the matching circuit substrate is bonded to a SAW-device-mounted substrate. With this configuration, the resulting package is simplified.

Cited reference 2 (Japanese Unexamined Patent Application Publication No. 6-97761: Branching Filter and Method Therefor) discloses the following type of SAW apparatus. In a branching circuit, an impedance matching device and a phase matching device are embedded in a portion of a package other than a portion in which a SAW filter device is accommodated. With this arrangement, the size of the SAW apparatus is reduced while maintaining the isolation of the filter device.

To reduce the number of components, research has been actively conducted on SAW apparatuses provided with a balanced-to-unbalanced conversion function, i.e., a so-called "balun function". Such SAW apparatuses are most widely used in Global System for Mobile communications (GSM) cellular telephones, which are used on a world-wide basis, particularly in Europe.

A balun is a circuit for matching a balanced line and an unbalanced line. More particularly, when a balanced line, such as a twin-lead type feeder, and an unbalanced line, such as a coaxial cable, are directly connected, a balanced current disadvantageously flows to cause the feeder itself to operate as an antenna. Accordingly, the balun circuit is provided to prevent the generation of a balanced current, thereby matching the balanced line and the unbalanced line.

Several patent applications concerning SAW apparatuses provided with the above-described balun function have been filed. As a SAW device used in a SAW apparatus provided with the balun function in which the input impedance and the output impedance are substantially the same, the configuration shown in FIG. 18 is commonly used.

In the SAW device shown in FIG. 18, on a piezoelectric substrate 100, a comb-like electrode (which is also referred to as an "interdigital electrode" and is hereinafter referred to as an "IDT") 101 is provided as the balanced portion. IDTs 102 and 103 are respectively provided on the left and right sides of the IDT 101 (in a SAW propagating direction) as the unbalanced portion. Reflectors 104 and 105 for improving transmission efficiency by reflecting the propagated SAW thereon are arranged such that they sandwich the IDTs 101, 102, and 103 therebetween. A SAW device having three IDTs arranged along a SAW propagating direction is referred to as a "3 IDT-type extensionally-coupled-resonator-mode SAW device".

In the above-described SAW device, reflectors 107 and 108 are arranged such that they sandwich an IDT 106 therebetween to define a SAW resonator. The SAW resonator is connected in series to the IDTs 102 and 103. Additionally, balanced signal terminals 109 and 110 connected to the IDT 101 and an unbalanced signal terminal 111 connected to the IDT 106 are also provided.

In a SAW apparatus provided with the above-described balun function, equal amplitude characteristics and 180°-inverted phase characteristics are required as transmission characteristics in a pass band between the unbalanced signal terminal 111 and each of the balanced signal terminals 109 and 110. The amplitude characteristics and the phase characteristics described above are referred to as the "amplitude balance degree" and the "phase balance degree", respectively.

The amplitude balance degree and the phase balance degree are defined as follows. When the above-described SAW device having a balun function is used as a three-port device, and when the unbalanced input terminal is a first port, and the balanced output terminals are a second port and a third port, the amplitude balance degree [A] is defined as A=[20log(S21)]−[(20log(S31)], and the phase balance degree is defined as [B-180] in which B is [∠S21−∠S31], where S21 is the transfer factor from the first port to the second port, and S31 is the transfer factor from the first port to the third port, and where the symbol [ ] represents an absolute value.

Ideally, in the pass band of a SAW apparatus, the amplitude balance degree is 0 dB, and the phase balance degree is 0 degrees. As one example of a SAW apparatus having a balun function, the SAW device shown in FIG. 18 is mounted on a package 200 shown in FIGS. 20 and 21.

On the reverse surface (external surface) of the package 200, as shown in FIG. 19, an external terminal 201, which is an unbalanced signal terminal, and external terminals 202 and 203, which are balanced signal terminals, are arranged along the peripheral portions of the reverse surface.

Within the package 200, as shown in FIG. 20, a die attach portion 204 is provided for holding the SAW device shown in FIG. 18 and for electrically connecting the SAW device to external devices. In wiring patterns of the die attach portion 204, the external terminal 201 and a wiring pattern 302, which are disposed adjacent to one another, are connected, the external terminal 202 and a wiring pattern 303, which are disposed adjacent to one another, are connected, and the external terminal 203 and a wiring pattern 304, which are disposed adjacent to one another, are connected.

In the known SAW apparatus, however, the following problems are presented.

In the package 200 shown in FIG. 19, the balanced-signal external terminals 202 and 203 cannot be symmetrically disposed with respect to the unbalanced-signal external terminal 201. Accordingly, the balance degrees between the balanced-signal external terminals 202 and 203 are decreased.

The reason for this is, for example, as follows. Because of the arrangement of the external terminals 201, 202, and 203 on the reverse surface of the package 200, the distance from the unbalanced-signal external terminal 201 to the balanced-signal external terminal 202 is different from the distance from the unbalanced-signal external terminal 201 to the balanced-signal external terminal 203. Accordingly, the bridge capacitance generated between the unbalanced-signal external terminal 201 and the balanced-signal external terminal 202 is different from the bridge capacitance between the unbalanced-signal external terminal 201 and the balanced-signal external terminal 203.

In the wiring patterns on the die attach portion 204 of the package 200, electrodes that are symmetrical with respect to the individual components cannot be provided, thereby decreasing balancing characteristics.

Additionally, in the SAW device shown in FIG. 18, the electrical polarity between the adjacent electrode fingers of the IDT 102 and the IDT 101 is different from that of the adjacent electrode fingers between the IDT 103 and the IDT 101. Accordingly, the balance degree of the SAW device itself is not sufficient, and thus, the balance degree of the SAW apparatus is not sufficient.

To solve these problems, the following SAW apparatus has been considered. As shown in FIG. 21, the wiring patterns are arranged by using strip lines 402 on the die attach portion 204 of the package 200, such that balanced-signal terminals 502 and 503 are disposed symmetrically with respect to an unbalanced-signal terminal 501, as shown in FIG. 22. In another configuration, an induction component defined by the strip lines 402 is provided to thereby improve the balance degree of the SAW device.

In the above-described configurations, however, when the strip lines 402 are provided on the die attach portion 204, an area for forming a bonding bump on the die attach portion 204 is decreased.

Accordingly, due to the reduced bump forming area on the SAW device, the flexibility of the layout on the SAW device is decreased. For example, the number of connecting portions between a grounding pattern of the die attach portion 204 and the package 200 is reduced, thereby weakening the grounding force. This adversely influences the electrical characteristics of the SAW device. Additionally, due to a limited number of bumps, the bonding strength is also decreased.

SUMMARY OF THE INVENTION

To overcome the above-described problems, according to one preferred embodiment of the present invention, a SAW apparatus is provided which includes a SAW device disposed on a piezoelectric substrate. The SAW device according to this preferred embodiment includes at least one interdigital electrode, and balanced signal terminals provided for at least an input side and an output side. A multi-layered retaining substrate includes external terminals for connecting the balanced signal terminals to an external device. The multi-layered retaining substrate is provided to retain the SAW device such that the interdigital electrode faces the surface of the multi-layered retaining substrate. An electrical circuit is arranged between the layers of the multi-layered retaining substrate such that the electrical circuit is located between the balanced signal terminals and the external terminals to increase balance degrees between the balanced signal terminals.

According to the above arrangement, since the SAW device includes at least one interdigital electrode and balanced signal terminals for at least the input side and the output side, a balun function is provided for the SAW device.

The retaining substrate is multi-layered, and an electrical circuit is provided between the layers of the retaining substrate. Accordingly, the flexibility to arrange the connecting and wiring patterns of the electrical circuit in the retaining substrate is greatly improved. Thus, electrical characteristics are uniform. For example, the bridge capacitance generated between the external terminal connected to the unbalanced signal terminal and the external terminal connected to one of the balanced signal terminals is approximately equal to the bridge capacitance generated between the external terminal connected to the unbalanced signal terminal and the external terminal connected to the other balanced signal terminal, thereby improving the balance degrees between the balanced signals.

Additionally, in the above-described configuration, by providing the electrical wiring pattern between the layers of the retaining substrate, connecting portions between the grounding wiring pattern on the retaining substrate and the grounding external terminal are increased such that a grounding force is strengthened. As a result, the attenuation in a frequency range other than the pass band is greatly improved.

In the aforementioned SAW apparatus, the external terminals are preferably arranged substantially symmetrically with respect to the center of a package by using the electrical circuit. Thus, electrical characteristics are uniform. For example, the bridge capacitance generated between the external terminal connected to the unbalanced signal terminal and the external terminal connected to one of the balanced signal terminals is approximately equal to the bridge capacitance generated between the external terminal connected to the unbalanced signal terminal and the external terminal connected to the other balanced signal terminal, thereby greatly improving the balance degrees between the balanced signals.

In the aforementioned SAW apparatus, the electrical circuit includes an adjusting portion provided for at least one of the balanced signal terminals of the SAW device to improve a signal propagation characteristic of the balanced signal terminal. The adjusting portion is defined by at least one of a delay line, a reactance component, and a resistance component, or other suitable component.

In the aforementioned SAW apparatus, the electrical circuit further preferably includes adjusting portions for both of the balanced signal terminals of the SAW device, and the adjusting degree of one of the adjusting portion for one of the balanced signal terminal is different from the adjusting degree of the other adjusting portion for the other balanced signal terminal.

With the above arrangement, a reactance component, a delay line, or a resistance component is added to one of the balanced signal terminals, or different reactance components, different delay lines, or different resistance components are added to the corresponding balanced signal terminals, thereby more reliably improving the balance degrees between the balanced signal terminals.

In the aforementioned SAW apparatus, the SAW device further includes a longitudinally-coupled resonator-mode SAW element having at least three interdigital electrodes. Generally, in extensionally-coupled resonator mode SAW elements, the electrical environment is different among the balanced signal terminals, and thus, the balance degrees between the balanced signal terminals substantially deteriorate. In the above-described configuration, however, due to the electrical circuit, the balance degrees are reliably maintained.

In the aforementioned SAW apparatus, the SAW device is constructed such that an electrical neutral point is not provided between the balanced signal terminals. Generally, in a SAW device provided without an electrical neutral point between the balanced signal terminals, it is difficult to arrange the external terminals symmetrically with respect to the center of the retaining substrate. In the above-described configuration, however, because of the multi-layered retaining substrate and the electrical circuit, the balance degrees between the balanced signal terminals are greatly improved.

According to another preferred embodiment of the present invention, a communication apparatus includes at least one of the SAW apparatuses according to preferred embodiments of the present invention described above. With this configuration, by providing the composite SAW apparatus which exhibits excellent transmission characteristics, the number of components is decreased, and accordingly, the size of the overall communication apparatus is reduced. Additionally, the transmission characteristics of the communication apparatus are greatly improved.

Other features, elements, characteristics and advantages of the present invention will become more apparent from the following detailed description of the preferred embodiments thereof with reference to the attached drawings.

DETAILED DESCRIPTION OF PREFERRED EMBODIMENTS

Preferred embodiments of the present invention are described in detail below with reference to FIGS. 1 through 17.

A SAW apparatus according to a first preferred embodiment of the present invention is discussed below with reference to FIGS. 1 through 6. In the following description, a SAW apparatus is described in the context of a DCS receiving filter although other types of SAW apparatuses are also included in the scope of the present invention.

Figure 1:
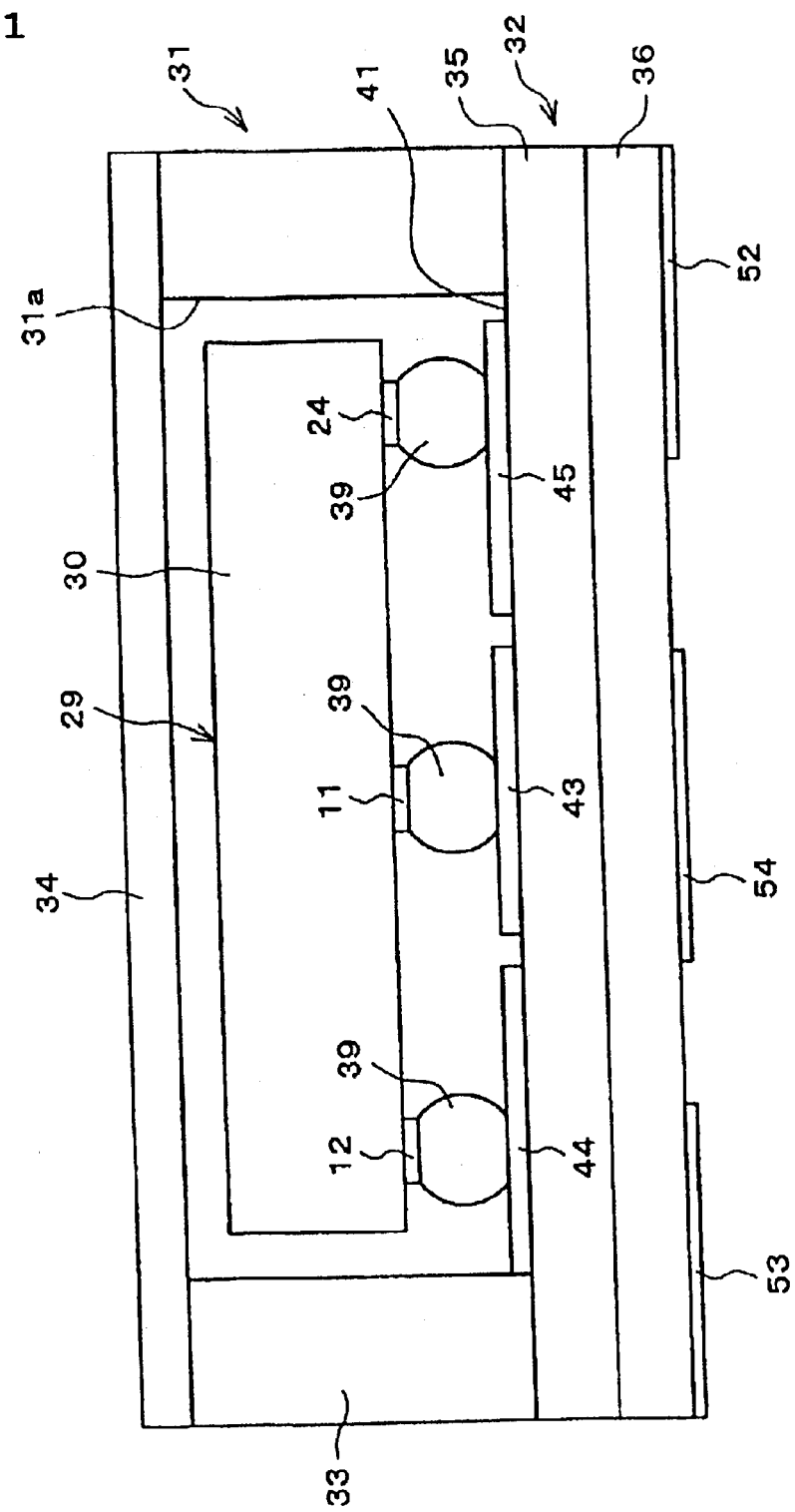
FIG. 1 is a sectional view schematically illustrating a SAW apparatus according to a first preferred embodiment of the present invention.
Figure 2:
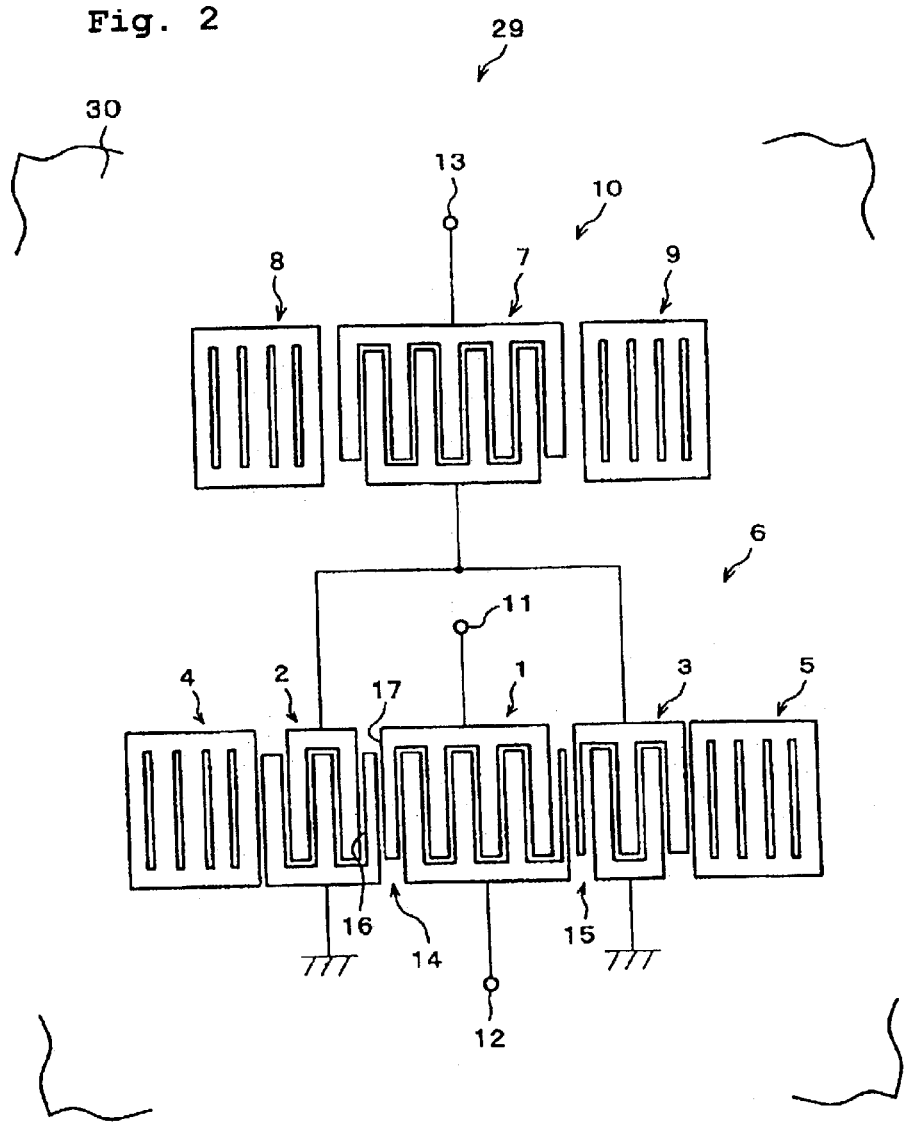
FIG. 2 is a schematic diagram illustrating a SAW device used in the SAW apparatus shown in FIG. 1.
Figure 3:
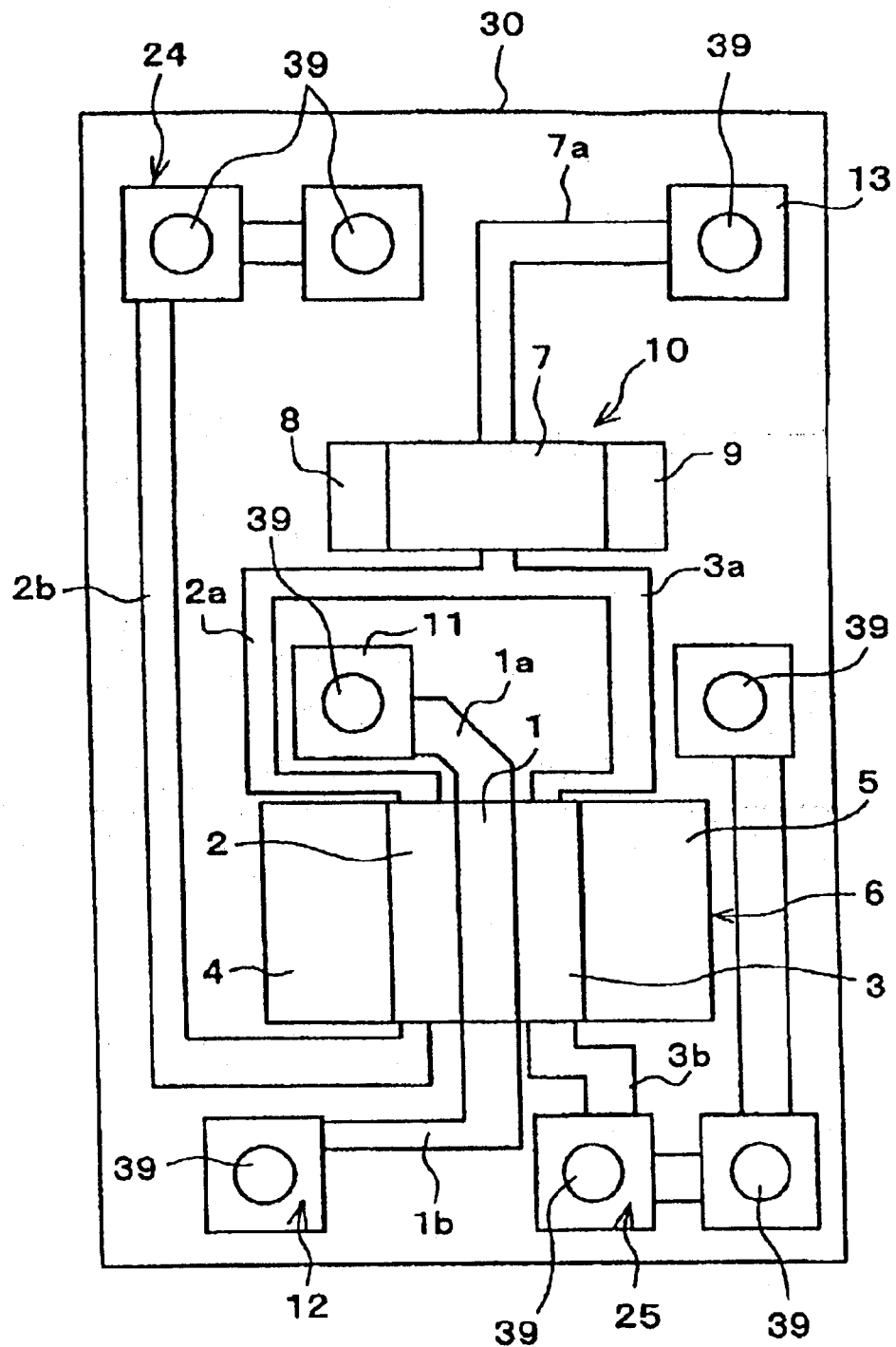
FIG. 3 is a schematic diagram illustrating the layout of a longitudinally-coupled resonator mode SAW element, a SAW resonator, balanced signal terminals, and an unbalanced signal terminal on a substrate used in the SAW apparatus shown in FIG. 1.

In the first preferred embodiment, as shown in FIG. 1, a SAW device 29 is disposed on a piezoelectric substrate 30 which is made of, for example, a 40±5° Y-cut X-propagating LiTaO$_3$ substrate. The SAW device 29 includes Al electrodes which are formed preferably by a photolithographic technique. FIG. 2 is a schematic diagram illustrating the electrode fingers of the SAW device 29 which define the SAW apparatus according to the first preferred embodiment of the present invention.

In the SAW device 29, IDTs 2 and 3, defining an unbalanced side, are disposed at the left and right sides of an IDT 1, defining a balanced side, in a SAW propagating direction. Reflectors 4 and 5 are disposed such that they sandwich the IDTs 2 and 3 therebetween. Thus, a longitudinally-coupled resonator mode SAW element 6, which defines a longitudinally-coupled resonator mode SAW filter, having a balun function is provided.

The IDTs 1, 2 and 3 each include a band-like base portion (bus bar) and two electrode portions provided with a plurality of electrode fingers. The electrode fingers extend in a direction that is substantially perpendicular to the two sides of the base portion such that they are substantially parallel to each other. The electrode fingers are interdigitated such that the sides thereof face each other.

In the above-configured IDTs 1, 2, and 3, the signal conversion characteristics and the pass band are determined by setting the length and the width of each electrode finger, the gap between adjacent electrode fingers, and the length of the opposing portions of the interdigitated electrode fingers (hereinafter referred to as the "interdigital length"). Other IDTs discussed below have configurations and functions similar to those of the IDTs 1, 2, and 3.

In the above-described SAW device 29, reflectors 8 and 9 are disposed such that they sandwich an IDT 7 therebetween to form a SAW resonator 10. The SAW device resonator 10 is connected in series to the IDTs 2 and 3. Balanced signal terminals 11 and 12 are connected to the IDT 1, while an unbalanced signal terminal 13 is connected to the IDT 7.

The SAW device 29 of the first preferred embodiment is configured such that an electrical neutral point is not located between the balanced signal terminals 11 and 12. More specifically, the pitch between the IDTs 1 and 2, and between the IDTs 1 and 3, for example, the pitch of the eight electrode fingers (for example, portions indicated by 14 and 15 in FIG. 2) is preferably less than the other electrode fingers of the IDTs. Accordingly, the continuity of the IDTs 1, 2, and 3 is maintained. To simplify FIG. 2, only a small number of electrode fingers are shown.

Details of the design dimensions of the extensionally-coupled resonator mode SAW device 29, and more specifically, the dimensions of the SAW element 6 are, for example, as follows, when the wavelength determined by a smaller pitch of the electrode fingers between the IDTs is indicated by $\lambda I_2$, and the wavelength determined by a larger pitch of the other electrode fingers is represented by $\lambda I_1$.

interdigital length W: 80.5 $\lambda I$
number of IDTs 2: 23(4)
number of IDTs 1: 34(4)
number of IDTs 3: 23(4)

(numbers in parentheses indicate the number of smaller-pitch electrode fingers.)

wavelength $\lambda I_1$ of IDTs: 2.1746 $\mu$m
wavelength $\lambda I_2$ of IDTs: 1.9609 $\mu$m
wavelength $\lambda R$ of reflectors: 2.1826 $\mu$m
number of reflectors: 150
gap between electrode fingers:
  portion between a wavelength $\mu I_1$ electrode finger and a wavelength $\lambda I_2$ electrode finger (indicated by 16 in FIG. 2): 0.25 $\lambda I_1$+0.25 $\lambda I_2$
  portion between wavelength $\lambda I_2$ electrode fingers (indicated by 17 in FIG. 2): 0.50 $\lambda I_2$
gap between IDT and reflector: 0.46 $\lambda R$
IDT duty:
  wavelength $\lambda I_1$ portion: 0.63
  wavelength $\lambda I_2$ portion: 0.60
reflector duty: 0.57
electrode thickness: 0.09 $\lambda I_1$ The dimensions of the SAW resonator 10 are as follows.
interdigital width W: 23.7 $\lambda I$
number of IDTs: 241
wavelength $\lambda I$ of IDTs : 2.1069 $\mu$m
wavelength $\lambda R$ of reflectors: $\lambda I$
number of reflectors: 30
gap between IDT and reflector: 0.50 $\lambda R$
IDT duty: 0.60
reflector duty: 0.60
electrode thickness: 0.09 $\lambda I$ A description is now given, with reference to FIG. 3, of the layout of the IDTs 1, 2, 3, and 7, the balanced signal terminals 11 and 12, and the unbalanced signal terminal 13 on the substrate 30 in the above-described SAW device 29. In this layout, in addition to the components indicated by the same reference numerals as those shown in FIGS. 1 and 2, grounding electrode pads 24 and 25 having a generally square shape are provided for bump bonding of the IDTs 2 and 3, respectively. The grounding electrode pads 24 and 25 are made of a metal which exhibits good conductivity, such as copper or aluminum, to ensure conductivity with a package 31 shown in FIG. 1.

Connecting/fixing bumps 39 for bump bonding are provided on each of the grounding electrode pads 24 and 25. Similarly, an electrode pad and bumps 39 are provided on each of the terminals 11, 12, and 13. In the SAW device 29, routing lines 1a, 1b, 2a, 2b, 3a, 3b, and 7a for connecting the IDTs 1, 2, 3, and 7 to the terminals 11, 12, and 13, and the electrode pads 24 and 25 are arranged on the substrate 30 such that they do not cross or contact each other.

The box-like package 31 of the SAW apparatus containing the SAW device 29 therein is discussed below with reference to FIG. 1. The package 31 includes a cavity 31a for containing the SAW device 29 therein, a bottom portion (device retaining substrate) 32, a side portion 33, and a cap (lid) 34.

The bottom portion 32 has two layers in the thickness direction, i.e., an upper layer 35 facing the cavity 31a and a lower layer 36 facing the exterior. External terminals 52, 53, and 54 for establishing electrical connection with an external substrate are provided on the bottom surface (facing the exterior) of the lower layer 36 of the bottom portion 32. A die attach portion 41 for establishing and maintaining electrical connection with the SAW device 29 is provided on the top surface (facing the cavity 31a) of the upper layer 35. Wiring patterns 43, 44, and 45 for the SAW device 29 and the die attach portion 41 are electrically and mechanically connected to the SAW device 29 via the bumps 39.

With this configuration, the SAW device 29 is mounted face-down on the package 31 such that the SAW element 6 faces the surface of the die attach portion 41. Since the SAW device 29 is electrically and mechanically connected to the die attach portion 41 via the bumps 39, a space is provided between the SAW element 6 and the die attach portion 41. Accordingly, there is no interference with the operation of the SAW element 6, and also, an electrical connection between the SAW element 6 and the die attach portion 41 is maintained.

Figure 4:
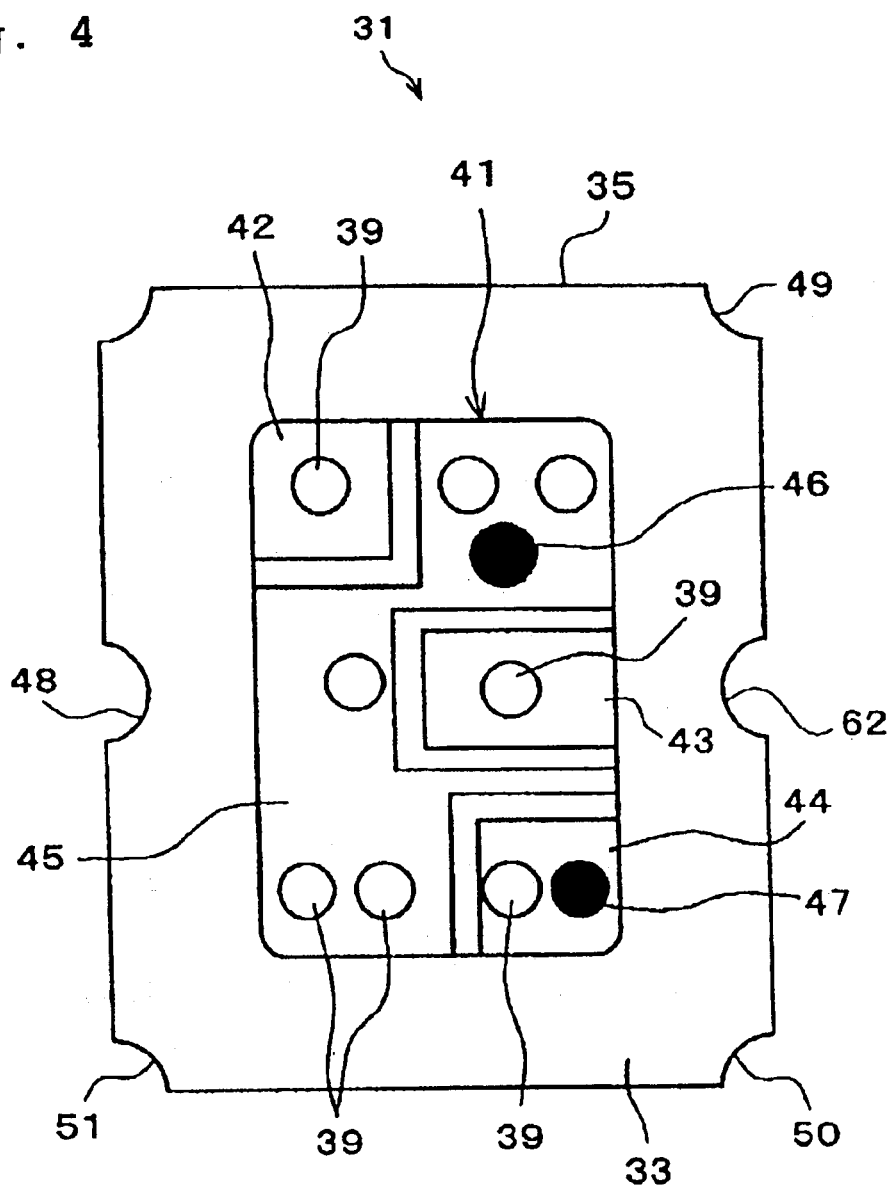
FIG. 4 is a schematic diagram illustrating the layout of a die attach portion in a package of the SAW apparatus shown in FIG. 1.

As shown in FIGS. 1 and 4, a wiring pattern 42 for establishing electrical connection with the unbalanced signal terminal 13, wiring patterns 43 and 44 (electrical circuits) for establishing electrical connection with the balanced signal terminals 11 and 12, respectively, and the grounding wiring pattern 45 (electrical circuit) are provided on the surface of the die attach portion 41 (top surface of the upper layer 35) of the package 31 such that the wiring patterns 42, 43, 44, and 45 do not contact each other.

Each of the unbalanced signal terminal 13 and the balanced signal terminals 11 and 12 may define either the input terminal or the output terminal. For example, when the unbalanced signal terminal 13 defines the input terminal, the balanced signal terminals 11 and 12 define the output terminals.

On the wiring patterns 42, 43, and 44, and the grounding wiring pattern 45, as shown in FIG. 4, substantially circular bumps 39 made of a conductive metal which exhibits excellent conductivity and ductility, such as gold, indicated by white dots in FIG. 4 are provided, and via-holes 46 and 47 (electrical circuits) indicated by black dots in FIG. 4 are provided.

The via-holes 46 and 47 are provided in the thickness direction of the upper layer 35 of the electrically insulating bottom portion 32. Then, a conductive metal is filled in the via-holes 46 and 47, thereby establishing electrical connection between the top and bottom surfaces of the upper layer 35.

The via-holes 46 and 47 also establish electrical connection with the top surface of the lower layer 36, that is, the via-holes 46 and 47 are connected to an electrical circuit (not shown) provided between the upper layer 35 and the lower layer 36.

Figure 5:
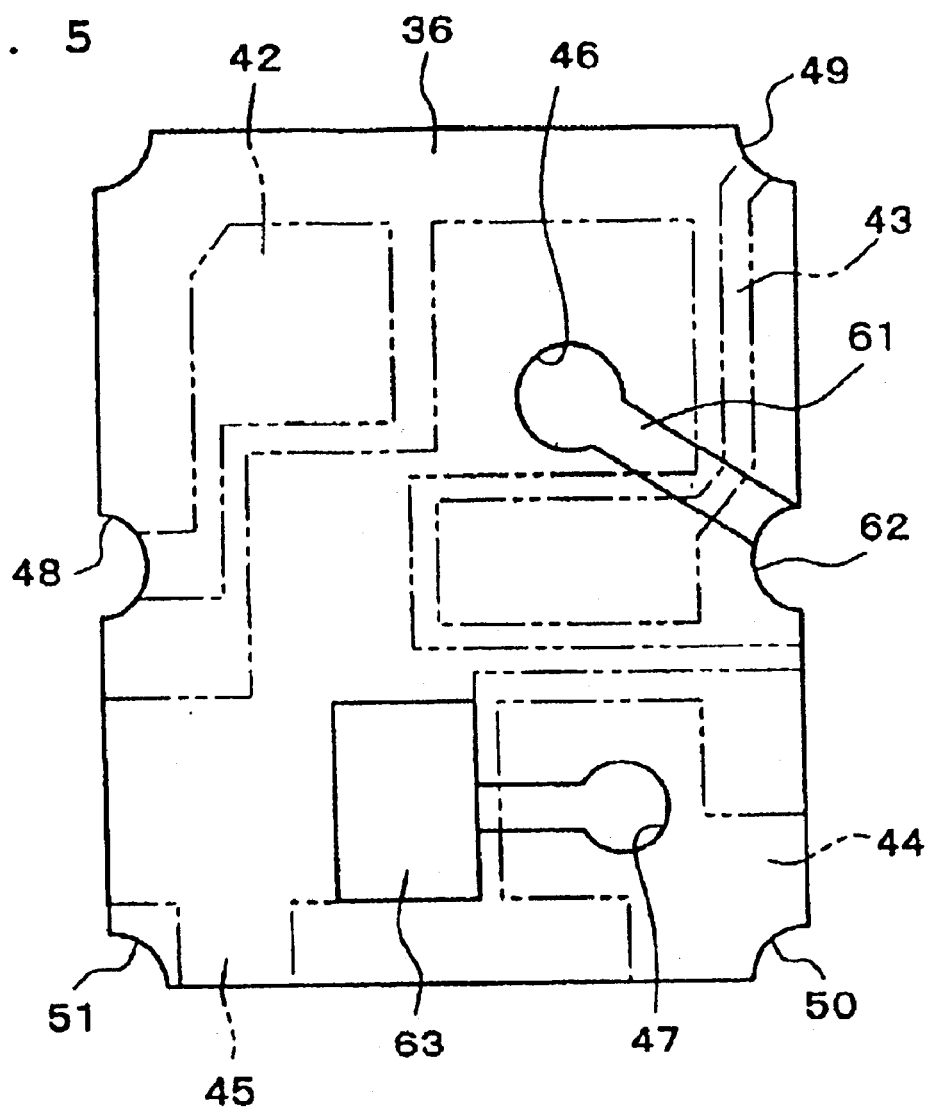
FIG. 5 is a plan view schematically illustrating a lower layer of a bottom portion of the package shown in FIG. 4.
Figure 6:
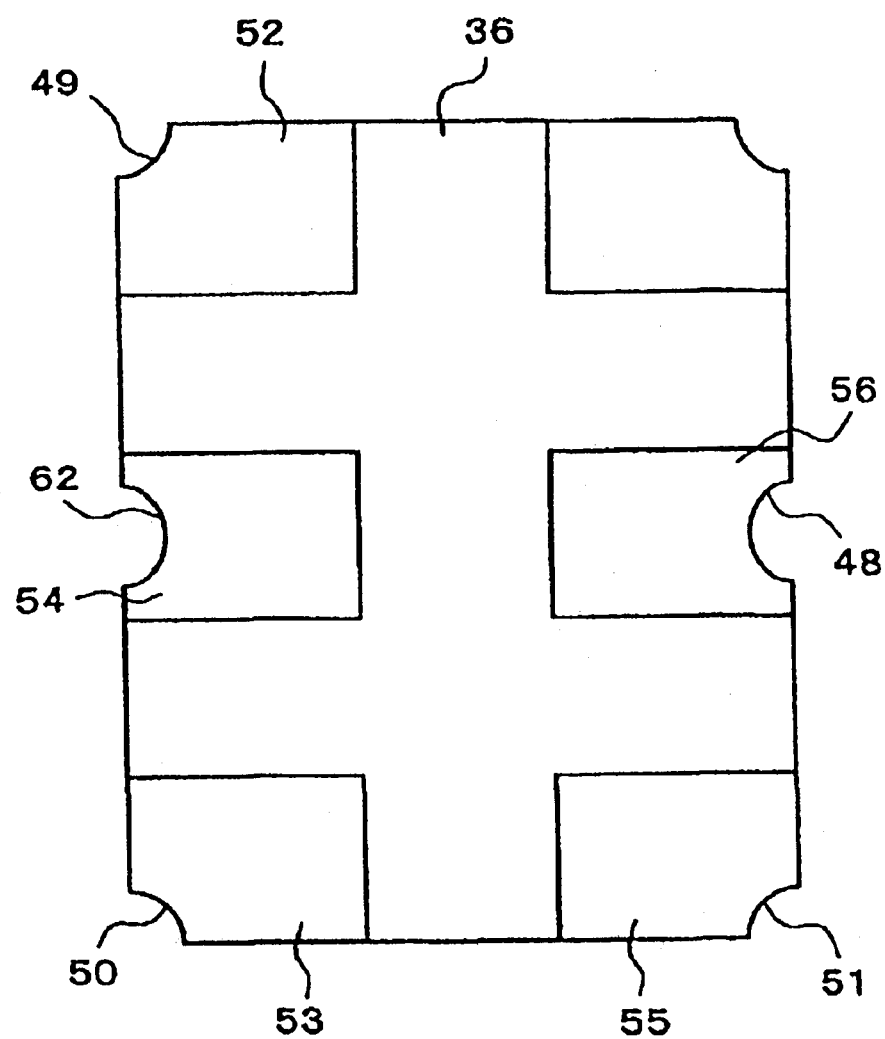
FIG. 6 is a plan view schematically illustrating the reverse surface of the package shown in FIG. 4.

FIG. 5 is a plan view illustrating the lower layer 36 of the bottom portion 32 shown in FIG. 1 when viewed from above (from the upper layer 35). FIG. 6 is a plan view illustrating the lower layer 36 when viewed from below. The two-dot-chain lines in FIG. 5 indicate the positions of the metallized patterns (wiring patterns 42, 43, 44, and 45) of the die attach portion 41 shown in FIG. 4. The metallized patterns are wiring patterns made of a conductive metallic film, for example, a nickel/gold-plated tungsten metallized film.

As shown in FIGS. 4 through 6, the unbalanced signal wiring patterns 42 and the balanced signal wiring patterns 43 and 44 are routed on the die attach portion 41 of the upper layer 35 of the bottom portion 32, and are connected to external terminals 56, 52, and 53 of the package 31 via castellations 48, 49, and 50, respectively.

With this configuration, symmetrical characteristics of the external terminals 52 and 53 with respect to the external terminal 56 and the center of the package 31 are greatly improved over known SAW devices, and more preferably, the external terminals 52 and 53 are perfectly symmetrical with respect to the external terminal 56 and the center of the package 31. Accordingly, the bridge capacitance generated between the external terminals 52 and 56 is substantially equal to that generated between the external terminals 53 and 56.

The grounding wiring pattern 45 of the die attach portion 41 is connected to a grounding external terminal 55 of the package 31 via a castellation 51, and is also connected to a grounding external terminal 54 of the package 31 via the via-hole 46, a grounding metallized pattern 61 (electrical circuit) and a castellation 62 of the lower layer 36 of the bottom portion 32.

The balanced signal terminal 44 is also connected to a metallized pattern (electrical circuit) 63 on the lower layer 36 of the bottom portion 32 via the via-hole 47. A capacitance is generated between the metallized pattern 63 and the grounding wiring pattern 45 on the die attach portion 41 of the upper layer 35 of the bottom portion 32. For example, a capacitance of, for example, approximately 0.4 pF is connected in parallel to the balanced signal wiring pattern 44.

Figure 7:
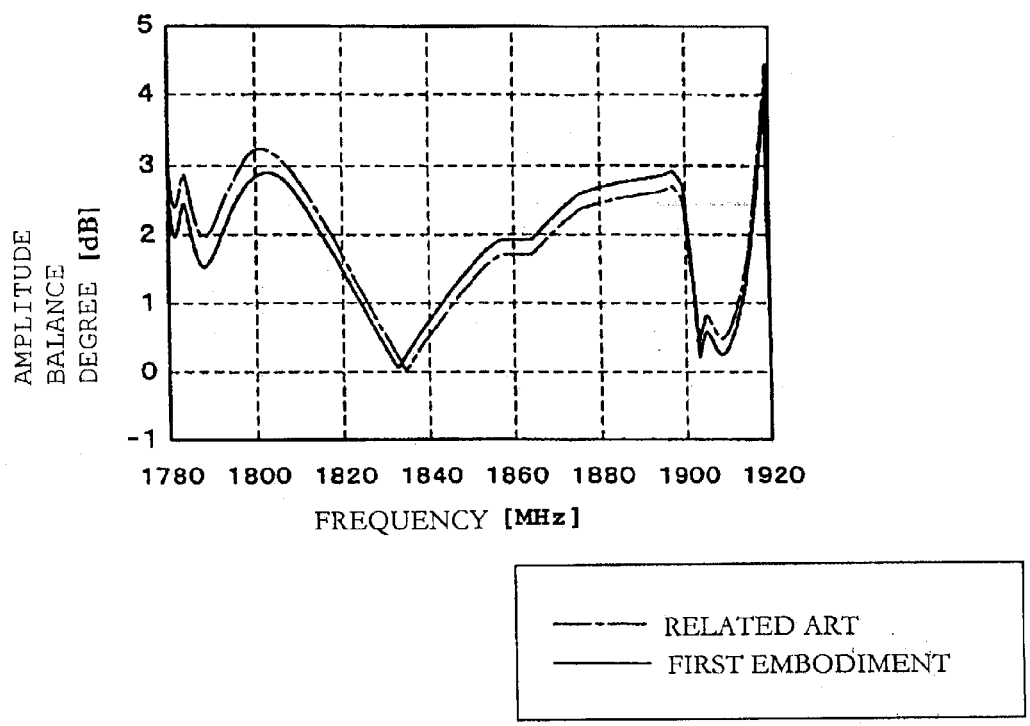
FIG. 7 is a graph illustrating a difference of the amplitude balance degree between the SAW apparatus shown in FIG. 1 and a known SAW apparatus.
Figure 8:
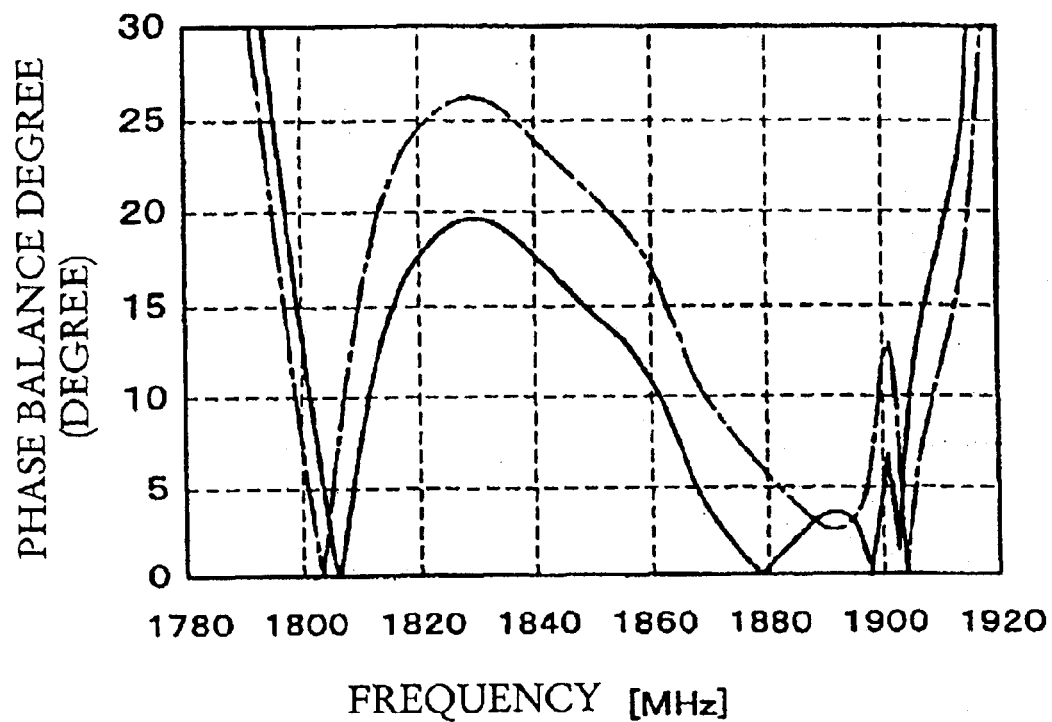
FIG. 8 is a graph illustrating a difference of the phase balance degree between the SAW apparatus shown in FIG. 1 and a known SAW apparatus.
Figure 21:
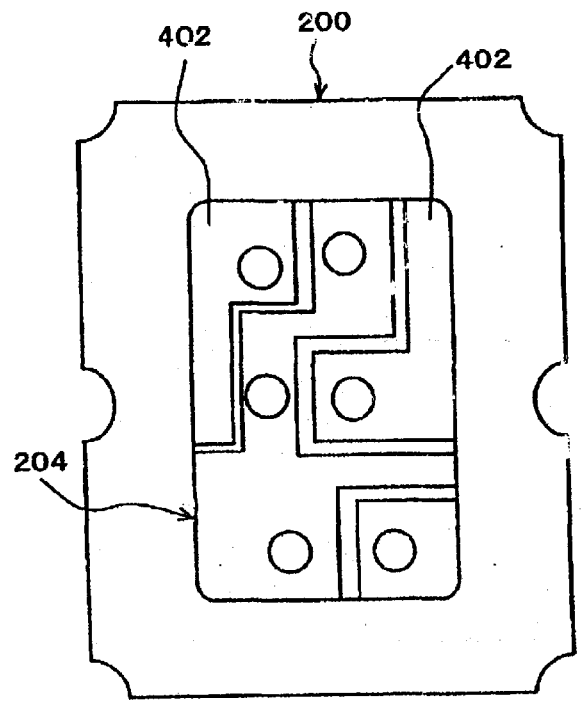
FIG. 21 is a plan view schematically illustrating another die attach portion in the package.
Figure 22:
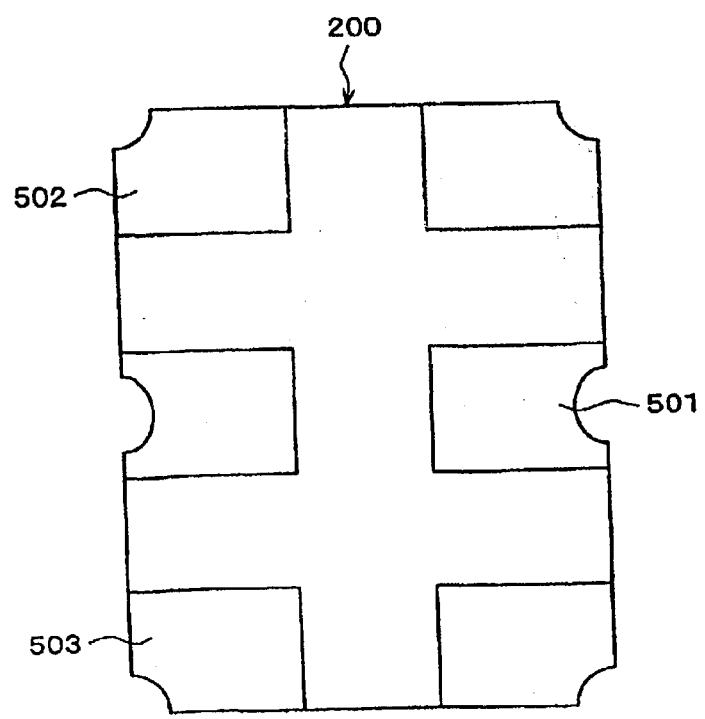
FIG. 22 is a plan view schematically illustrating external terminals connected to the die attach portion shown in FIG. 21.

The operation and advantages of the SAW apparatus according to the first preferred embodiment of the present invention are described below. FIGS. 7 and 8 are graphs illustrating the amplitude balance degree and the phase balance degree, respectively, obtained by the SAW apparatus of the first preferred embodiment with respect to a change in the frequency. For comparison, the amplitude balance degree and the phase balance degree of a SAW apparatus including the SAW device 29 of this preferred embodiment mounted on the known package 200 having a single layered bottom portion shown in FIG. 21 are also shown in FIGS. 7 and 8. The package 200 shown in FIG. 21 is also provided with the balanced signal external terminals 52 and 53 shown in FIG. 6.

The frequency range in the pass band of the DCS receiving filter is set, for example, from about 1805 MHz to about 1880 MHz. The maximum difference of the amplitude balance degree in this range resulting in the known SAW apparatus is 3.1 dB, while that of the first preferred embodiment is 2.9 dB. Thus, the amplitude balance degree is improved by about 0.2 dB. In regard to the phase balance degree, the maximum difference in the above-described frequency range resulting in the known SAW apparatus is 27 degrees, while that of the first preferred embodiment is 19 degrees. Thus, the phase balance degree is improved by about 8 degrees.

The reason for the improvements in the balance degrees of the first preferred embodiment is described below. A reactance component is added to the balanced signal external terminal 53 by providing the metallized pattern 63 on the lower layer 36 of the bottom portion 32 of the package 31, thereby decreasing the difference of the frequency characteristics between the balanced signal external terminals 52 and 53. As a result, the balance degrees between the external terminals 52 and 53 are greatly improved.

That is, the difference of the frequency characteristics between the balanced signal external terminals 52 and 53 varies according to the device configuration, the layout of electrodes on the die attach portion 41, or the designing parameters. Accordingly, the balance degrees are improved by adding a reactance component to the balanced signal external terminal 52.

Figure 9:
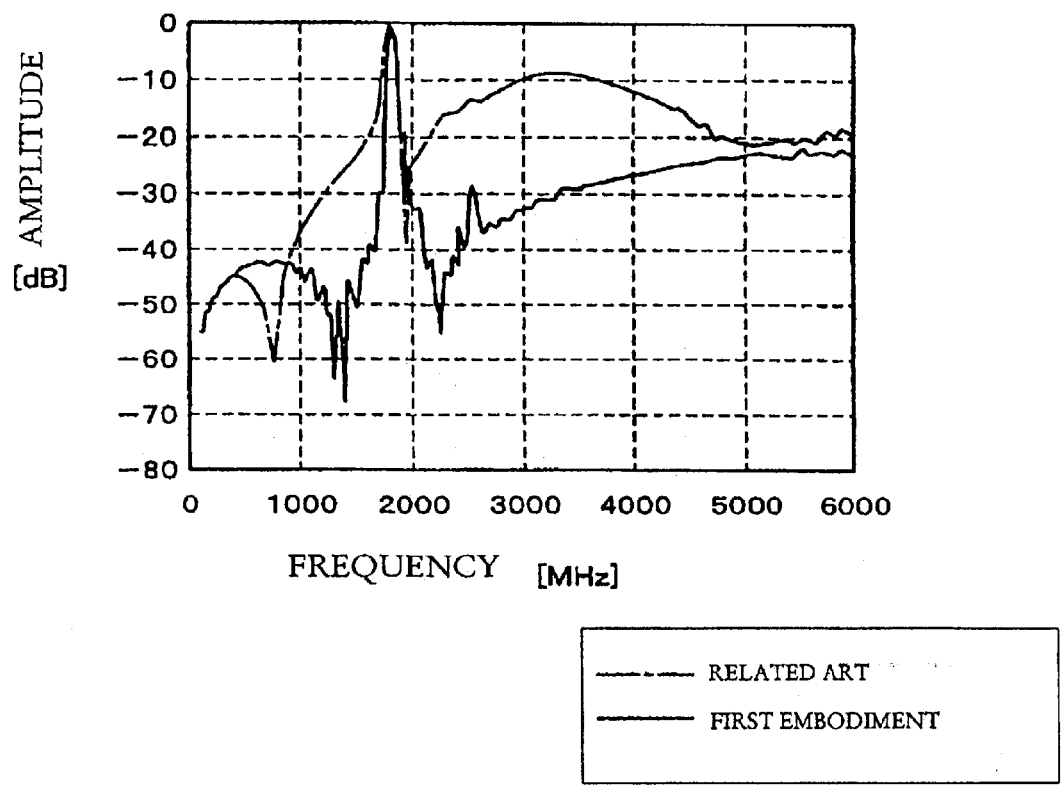
FIG. 9 is a graph illustrating a difference of the insertion-loss frequency characteristics between the SAW apparatus shown in FIG. 1 and a known SAW apparatus.

FIG. 9 is a graph illustrating the insertion-loss frequency characteristics of the SAW apparatus of the first preferred embodiment. For comparison, the insertion loss of a SAW apparatus including the SAW device 29 mounted on the known package 200 having a single-layered bottom portion shown in FIG. 21 is also indicated in FIG. 9. In the first preferred embodiment, the attenuation in a frequency range greater than the band pass, in particular, from 2500 MHz to 4000 MHz, is improved by a maximum of about 20 dB over the known SAW apparatus.

The reason for such an improvement in the attenuation is described below. The via-holes 46 and 47 are provided on the upper layer 35 of the bottom portion 32 of the package 31. Then, the grounding wiring pattern 45 of the die attach portion 41 is connected to the grounding external terminal 54 of the package 31 via the metallized pattern 63 on the lower layer 36. Accordingly, the connecting portions between the grounding wiring pattern 45 and the grounding external terminal 54 are increased so as to strengthen a grounding force, thereby improving the attenuation.

According to the configuration of the first preferred embodiment, the formation of an electrical neutral point between the balanced signal terminals is prevented. Generally, in a SAW apparatus provided with a balun function, it is more difficult to symmetrically dispose balanced signal terminals in a SAW apparatus without an electrical neutral point than that with an electrical neutral point because of its layout. Thus, the present invention is more effective when it is used in a SAW apparatus without an electrical neutral point. However, even in a SAW apparatus with an electrical neutral point, the balance degrees are reduced because of a difference between the polarity of adjacent electrode fingers of different IDTs. Thus, advantages similar to those offered by a SAW apparatus without an electrical neutral point are exhibited for a SAW apparatus with an electrical neutral point.

Figure 10:
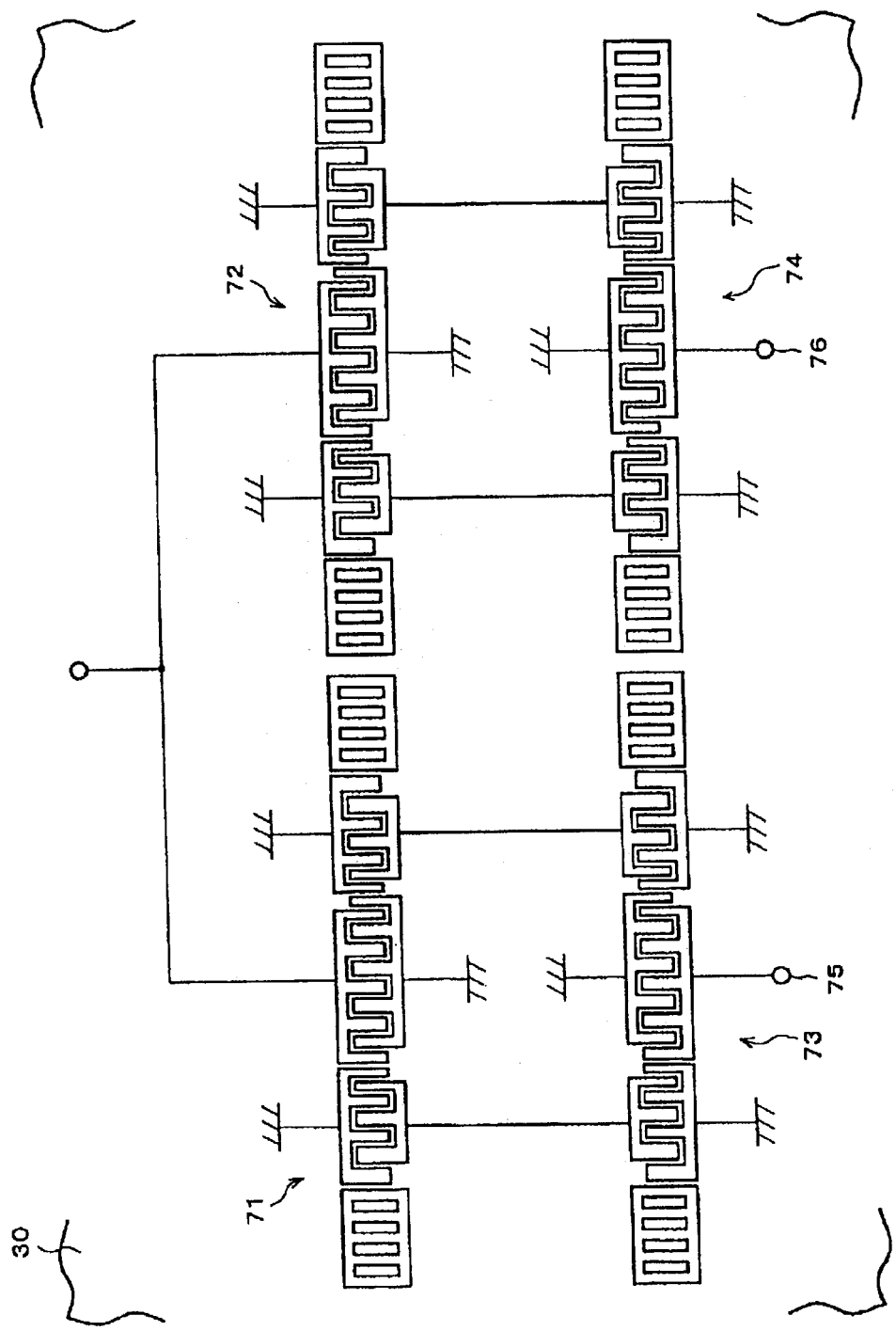
FIG. 10 is a schematic diagram illustrating an example of a modification made to the SAW device shown in FIG. 2 in which an electrical neutral point and a balun function are provided.

As an example of a modification made to the first preferred embodiment, a SAW apparatus with an electrical neutral point is shown in FIG. 10. In the SAW apparatus shown in FIG. 10, four extensionally-coupled resonator mode SAW devices 71 through 74 (the central IDTs of the SAW devices 73 and 74 are inverted) are used to provide a balun function. A balanced signal is output (or input) from (or into) signal terminals 75 and 76.

Figure 11:
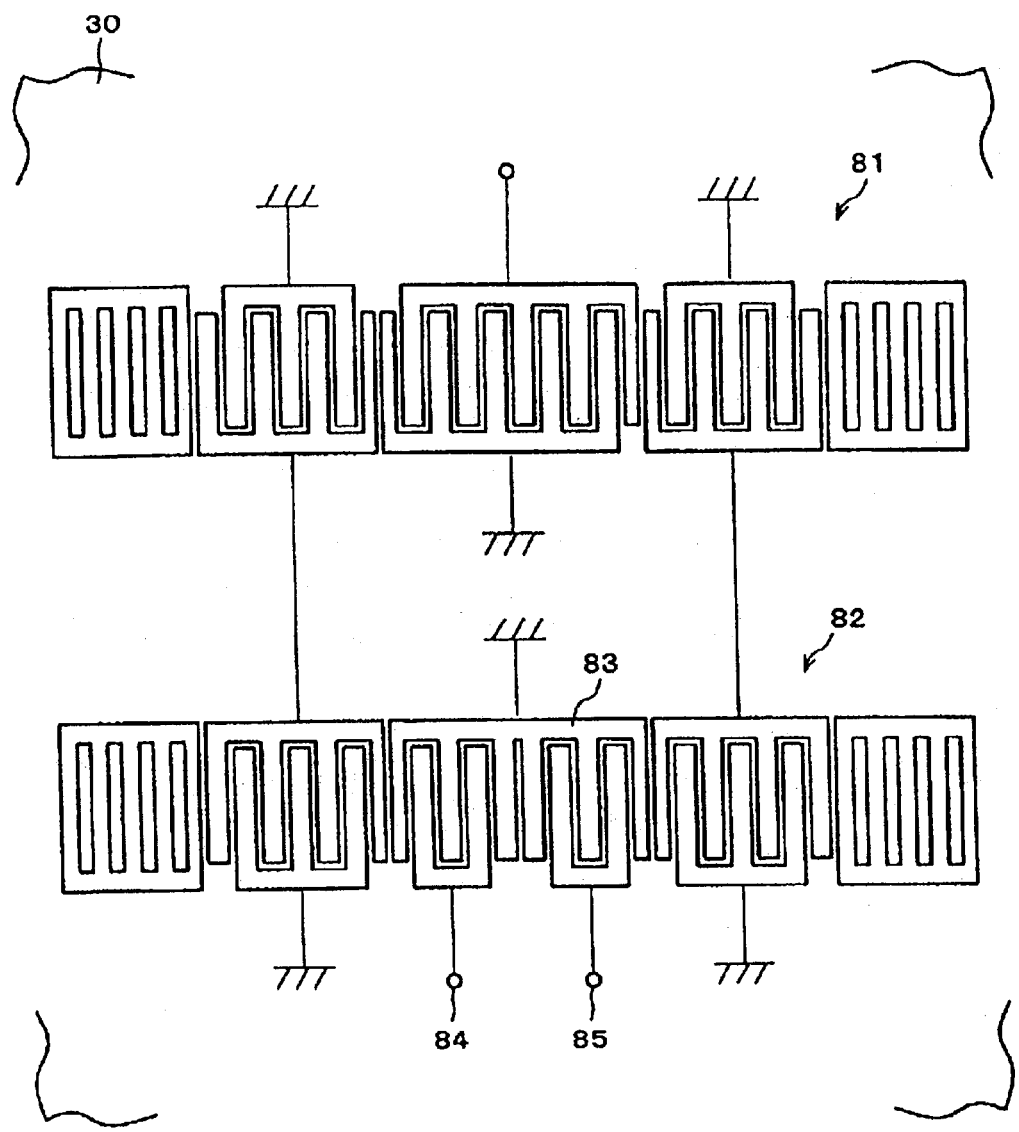
FIG. 11 is a schematic diagram illustrating another example of a modification made to the SAW device shown in FIG. 2 in which an electrical neutral point and a balun function are provided.

As another example of the modification made to the first preferred embodiment, a SAW apparatus with an electrical neutral point is shown in FIG. 11. In this SAW apparatus, the bottom portion 32 of the package 31 is multi-layered, and a metallized pattern is provided between the layers. Then, a reactance component is added to one of the balanced signal terminals. With this configuration, the balance degrees are greatly improved. Additionally, the connecting portions between the die attach portion and the grounding external terminal are increased so as to strengthen a grounding force, thereby improving the attenuation. In the SAW apparatus shown in FIG. 11, two extensionally-coupled resonator mode SAW devices 81 and 82 are cascade-connected, and an IDT 83 of the SAW device 82 is divided into two portions, thereby providing a balun function. A balanced signal is output (or input) from (or into) balanced signal terminals 84 and 85.

Figure 12:
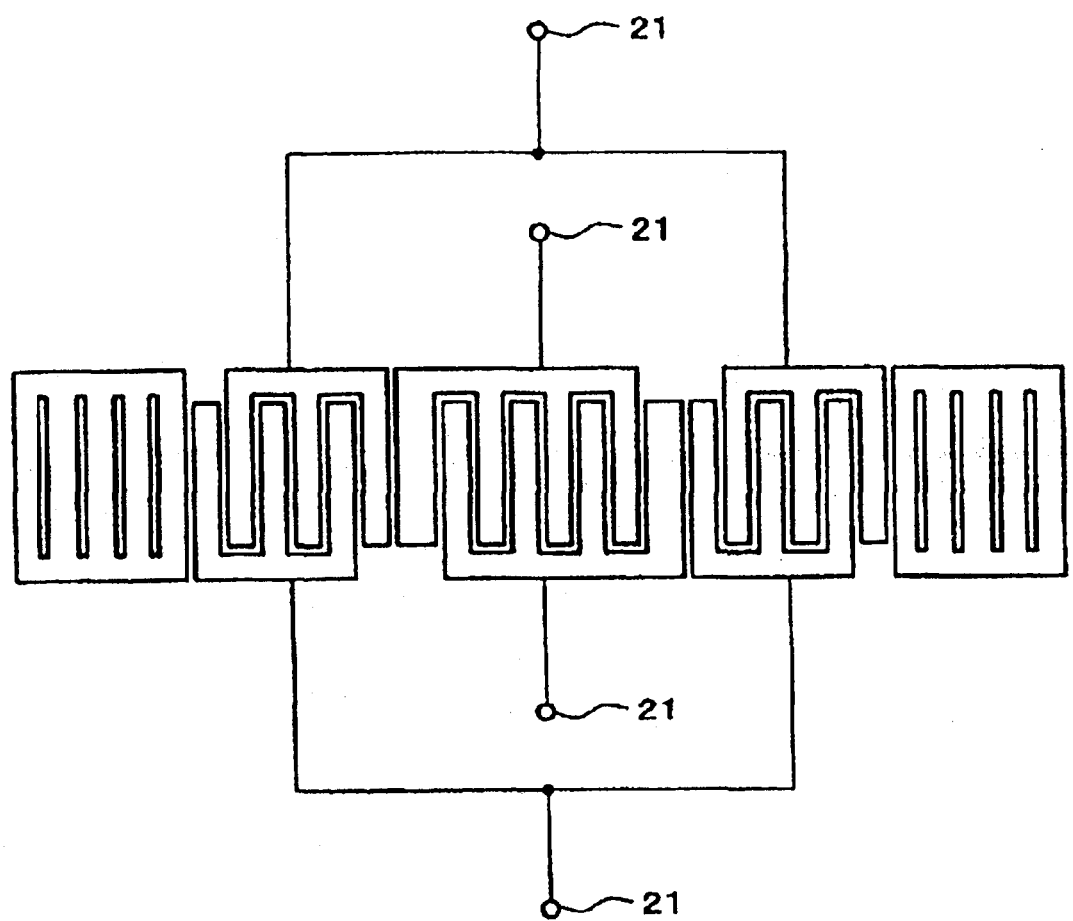
FIG. 12 is a schematic diagram illustrating still another example of a modification made to the SAW device shown in FIG. 2.

Still another example of the modification made to the first preferred embodiment is shown in FIG. 12. In this SAW apparatus, balanced signal terminals 21 serve as both the input signal terminal and the output signal terminal. By applying the present invention to this SAW apparatus, the balanced degrees and the attenuation is also improved.

Although in the first preferred embodiment the bottom portion 32 of the package 31 is defined by two layers, it may be defined by three or more layers. In this case, similarly, an adjusting portion including at least one of a reactance component, a delay line, and a resistance component is inserted between balanced signal terminals, and a grounding force is strengthened by increasing connecting portions between the die attach portion 41 and the grounding external terminal 54. As a result, advantages similar to those achieved by the first preferred embodiment are obtained.

In the first preferred embodiment, a balanced signal is output (or input) from (or into) the extensionally-coupled resonator mode SAW device 29. However, a transversely-coupled resonator mode SAW device or a transversal filter may be used for outputting (or inputting) a balanced signal. In this case, advantages similar to those achieved by the first preferred embodiment are obtained.

A SAW apparatus according to a second preferred embodiment of the present invention is described below with reference to FIGS. 13 and 14. The second preferred embodiment differs from the first preferred embodiment in the number of via-holes provided in the upper layer 35 of the bottom portion 32 and the configuration of the metallized patterns on the lower layer 36 of the bottom portion 32. In the second preferred embodiment, the SAW device 29 used in the first preferred embodiment is stored in a package 91 face-down.

Details of the design of the SAW device 29, the overall structure of the package 91, and the arrangement of the external terminals are similar to those of the first preferred embodiment, and an explanation thereof is thus omitted. FIG. 13 is a plan view illustrating the obverse surface of a die attach portion 92b provided on an upper layer 92a of a bottom portion 92. FIG. 14 is a plan view illustrating a lower layer 93 of the bottom portion 92 when viewed from above.

Figure 13:
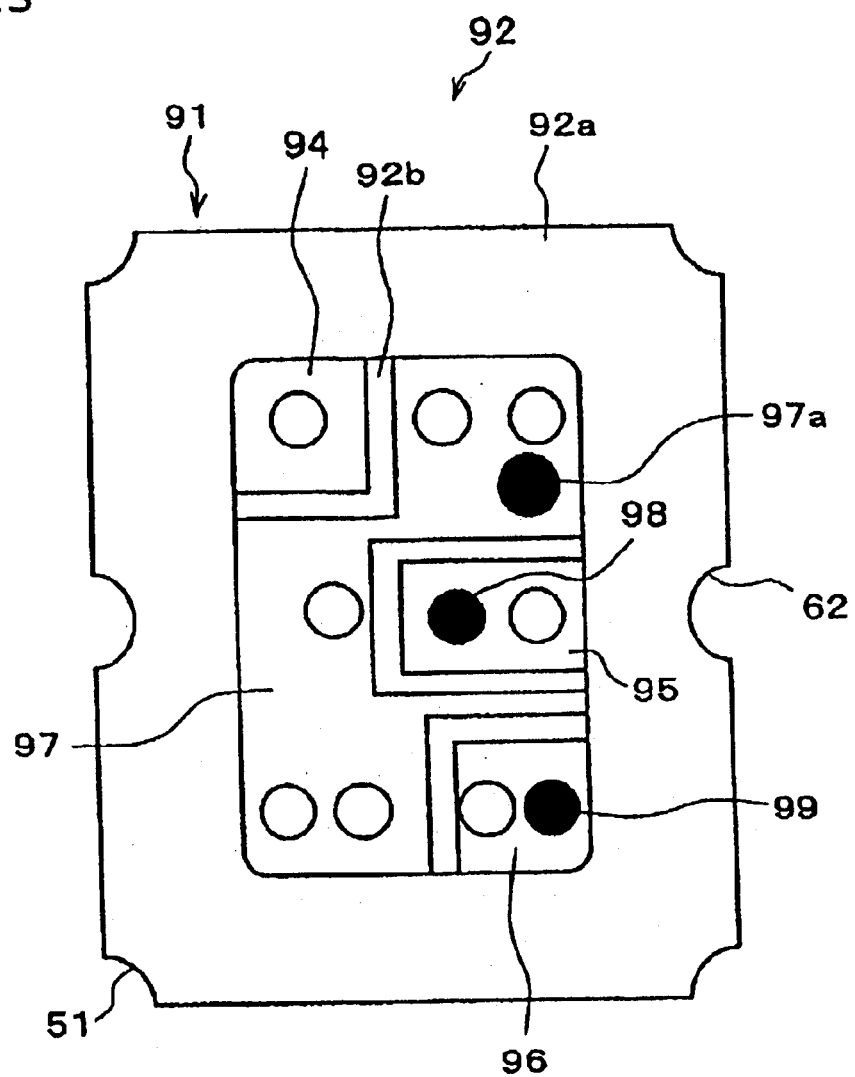
FIG. 13 is a plan view schematically illustrating a die attach portion in a package of a SAW apparatus according to a second preferred embodiment of the present invention.
Figure 14:
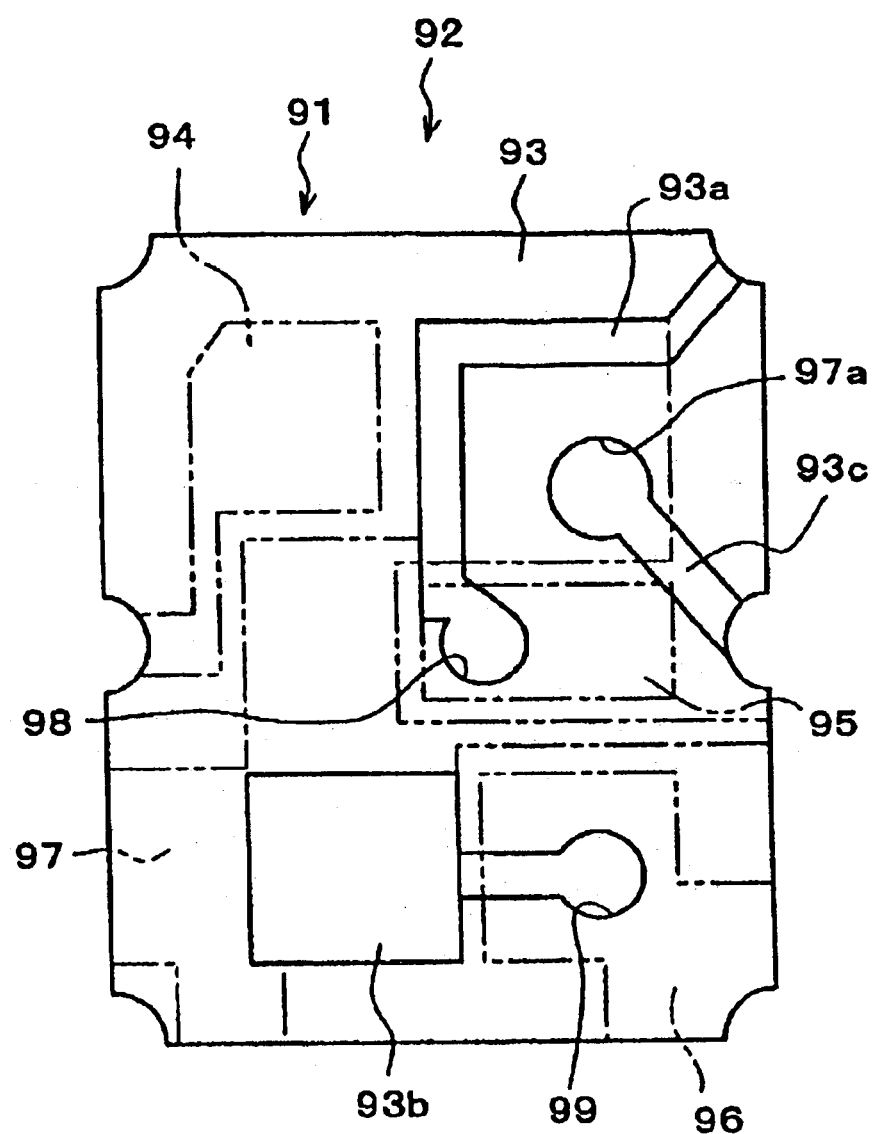
FIG. 14 is a plan view schematically illustrating a lower layer of a bottom portion of the package shown in FIG. 13.

Two-dot-chain lines shown in FIG. 14 indicate the positions of metallized wiring patterns (electrical circuits) 94, 95, 96, and 97 of the die attach portion 92b shown in FIG. 13. In the die attach portion 92b in FIG. 13, white dots represent the positions of bumps, while black dots designate the positions of via-holes 97a, 98, and 99. A wiring pattern 94 electrically connected to the unbalanced signal terminal 13, a wiring pattern 95 electrically connected to the balanced signal terminal 11, a wiring pattern 96 electrically connected to the balanced signal terminal 12, and a grounding wiring pattern 97 are also provided on the die attach portion 92b.

The wiring patterns 95 and 96 are respectively connected to metallized patterns (electrical circuits) 93a and 93b on the lower layer 93 via via-holes (electrical circuits) 98 and 99. The grounding wiring pattern 97 is connected to the grounding external terminal 55 via the castellation 51, and is also connected to the grounding external terminal 54 of the package 91 via a via-hole 97a, a metallized pattern (electrical circuit) 93c and the castellation 62 on the lower layer 93 of the bottom portion 92.

The metallized pattern 93a defines a reactance component, for example, a reactance component (inductance component) having a value of about 0.4 nH, is inserted in series to the balanced signal terminal 11. A capacitance is generated between the metallized pattern 93b and the grounding wiring pattern 97 on the die attach portion 92b of the upper layer of the bottom portion 32, for example, a reactance component (capacitance component) having a value of about 0.4 pF, is inserted in parallel to the balanced signal terminal 12. That is, a reactance component is added in series to the balanced signal terminal 11, and another reactance component is added in parallel to the balanced signal terminal 12.

In the above-described SAW apparatus, the layout of the external terminals 52, 53, 54, 55, and 56 of the package 91 is similar to the layout shown in FIG. 6. The wiring patterns 94, 95, and 96 shown in FIG. 13 are respectively connected to the external terminals 56, 52, and 53.

Figure 15:
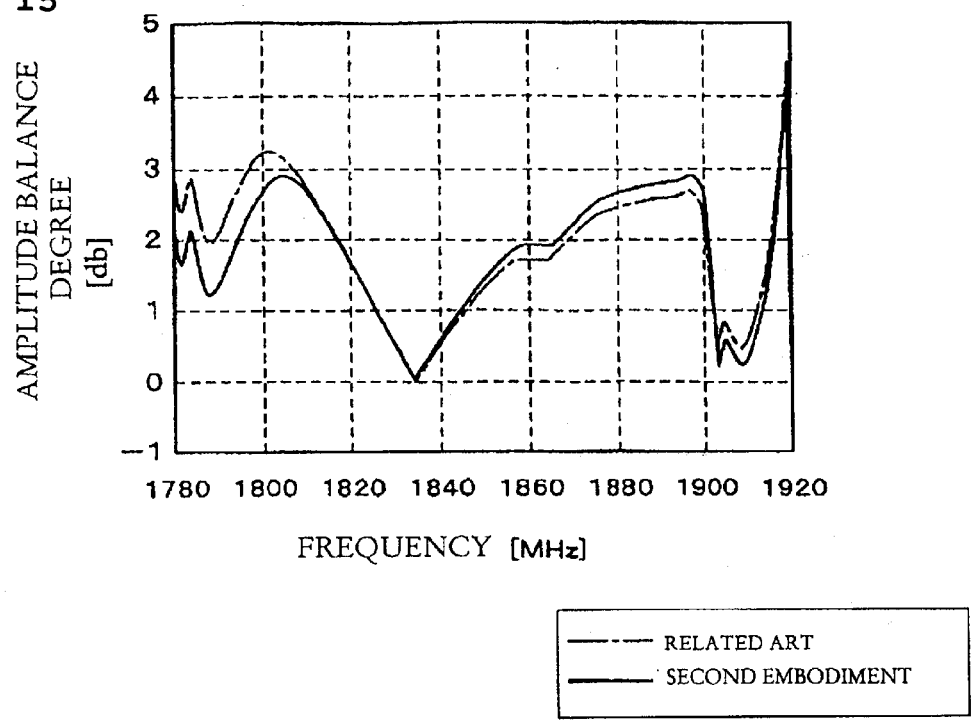
FIG. 15 is a graph illustrating a difference of the amplitude balance degree between the SAW apparatus of the second preferred embodiment and a known SAW apparatus.
Figure 16:
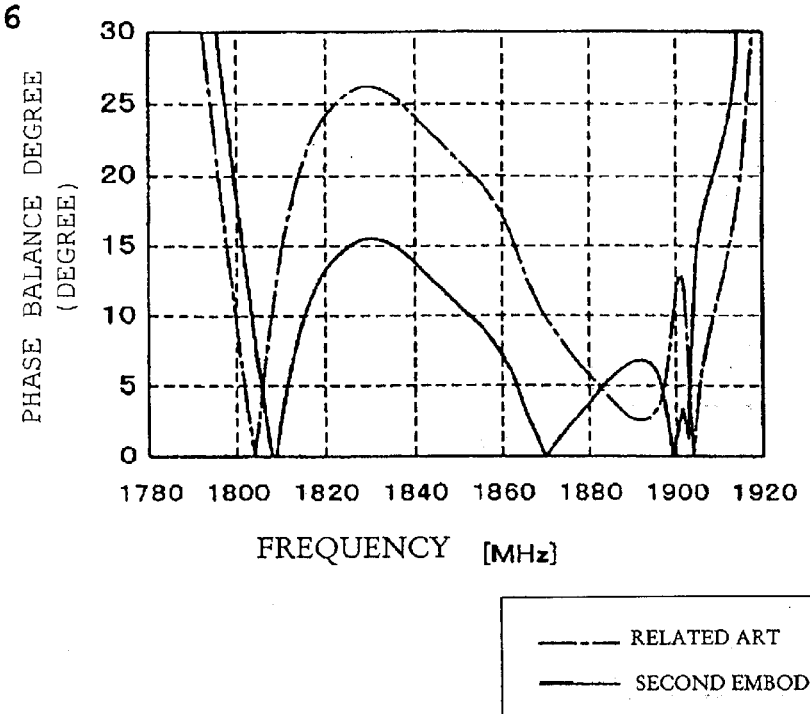
FIG. 16 is a graph illustrating a difference of the phase balance degree between the SAW apparatus of the second preferred embodiment and a known SAW apparatus.

The operation and advantages of the SAW apparatus of the second preferred embodiment are described below. FIGS. 15 and 16 are graphs illustrating the amplitude balance degree and the phase balance degree, respectively, obtained by the SAW apparatus of the second preferred embodiment with respect to a change in the frequency. For comparison, the amplitude balance degree and the phase balance degree resulting in a SAW apparatus including the SAW device 29 mounted on the known package 200 having a single layered bottom portion shown in FIG. 21 are also shown in FIGS. 15 and 16.

The frequency range of the pass band of a DSC receiving filter is preferably from about 1805 MHz to about 1880 MHz. The maximum difference of the amplitude balance degree in this range of the known SAW apparatus is 3.2 dB, while that of the second preferred embodiment is about 2.9 dB. Thus, the amplitude balance degree is improved by about 0.3 dB. In regard to the phase balance degree, the maximum difference in the above-described frequency range resulting in the known SAW apparatus is 27 degrees, while that of the second preferred embodiment is 16 degrees. Thus, the phase balance degree is improved by about 11 degrees.

This is because the difference of the frequency characteristics between the external terminals 52 and 53 is reduced so as to improve the balance degrees therebetween. That is, the bottom portion 92 is defined two layers, and electrical wiring patterns are inserted between the two layers. More specifically, the metallized pattern 93a, which is a stripline serving as a reactance component, is provided for the balanced signal terminal 11, while an overlap portion between the metallized pattern 93b on the lower layer 93 of the bottom portion 92 and the grounding wiring pattern 97 of the die attach portion 92b of the upper layer is provided for the balanced signal terminal 12. With this arrangement, different reactance components are added to the corresponding balanced signal terminals 11 and 12 to correct the difference of the frequency characteristics between the external terminals 52 and 53, thereby greatly improving the balance degrees therebetween.

As described above, according to the second preferred embodiment, in a SAW apparatus provided with a balun function, the metallized pattern 93a, that defines a stripline, is connected to the balanced signal terminal 11, while the overlap portion between the metallized pattern 93b on the lower layer 93 and the grounding wiring pattern 97 on the upper layer is provided for the other balanced signal terminal 12 such that different reactance components are added to the corresponding balanced signal terminals 11 and 12. With this arrangement, a SAW apparatus having greatly improved balance degrees over known SAW apparatuses is obtained.

In the first and second preferred embodiments, since electrical circuits are provided between the two layers of the bottom portion 32, the area on which the bonding bumps 39 are provided is not restricted, thereby strengthening a grounding force of the package 31 or 91.

Additionally, in the first and second preferred embodiments, reactance components are added via the metallized patterns provided on the top surface of the lower layer 36 of the bottom portion 32. Alternatively, delay lines or resistance components may be provided on the lower layer 36 of the bottom portion 32, in which case, advantages similar to those produced by the first and second preferred embodiments are obtained.

Figure 17:
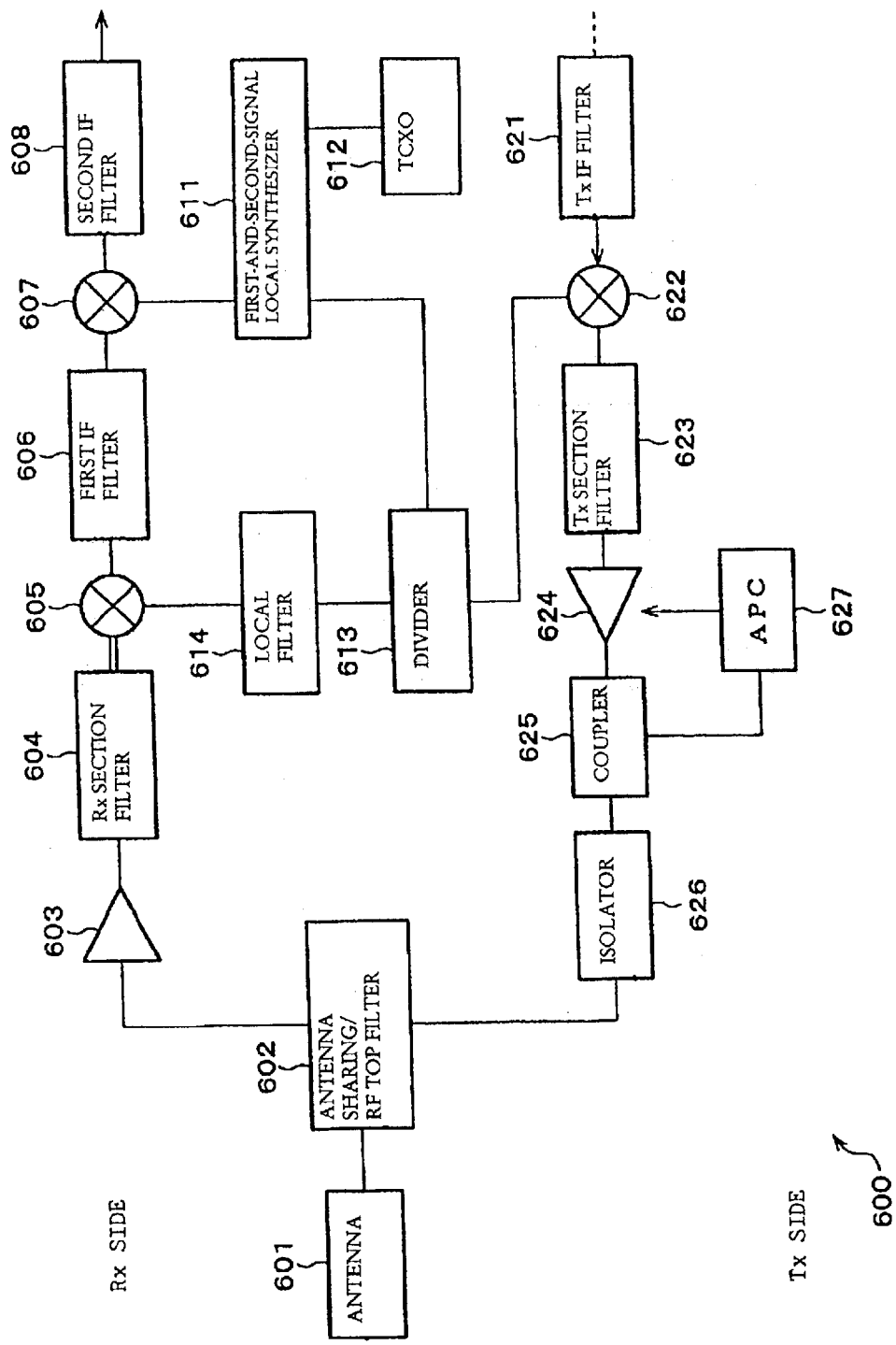
FIG. 17 is a block diagram illustrating the essential portion of a communication apparatus include the SAW apparatus of the first or second preferred embodiment according to a third preferred embodiment of the present invention.
Figure 18:
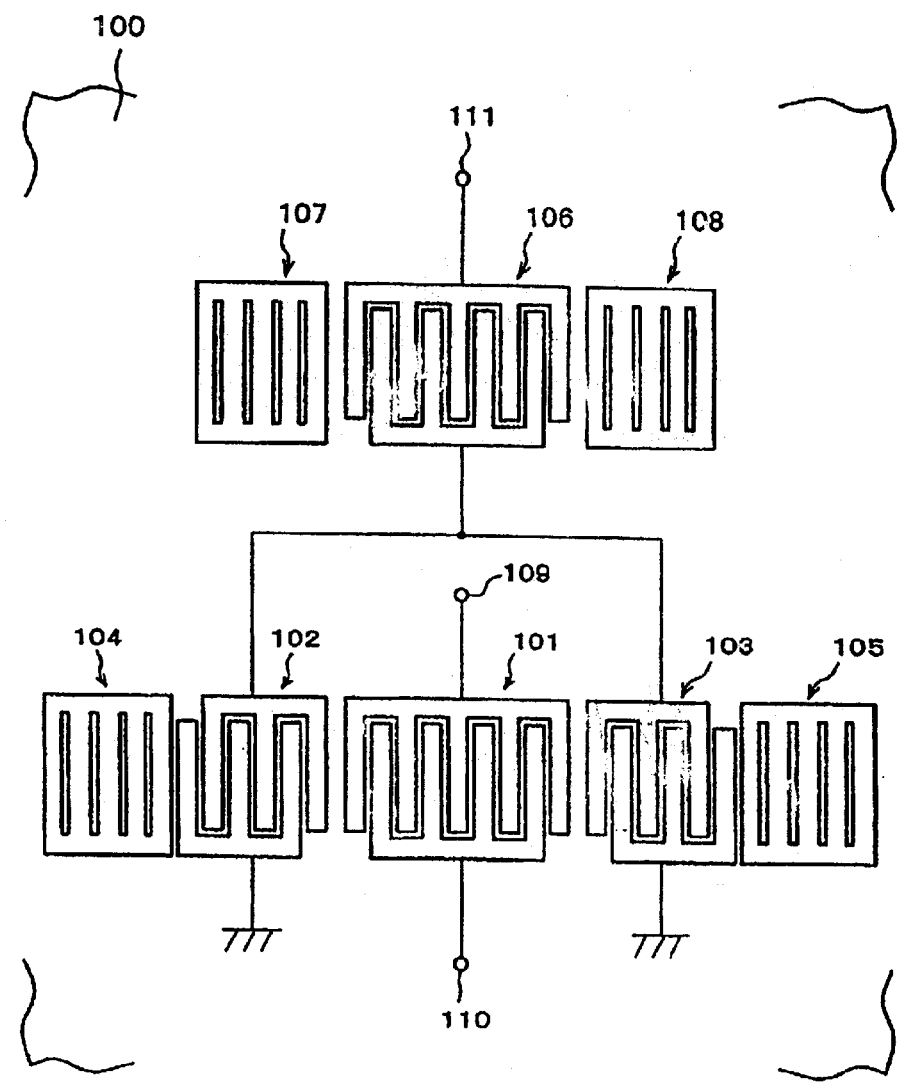
FIG. 18 is a schematic diagram illustrating a SAW device used in a known SAW apparatus.
Figure 19:
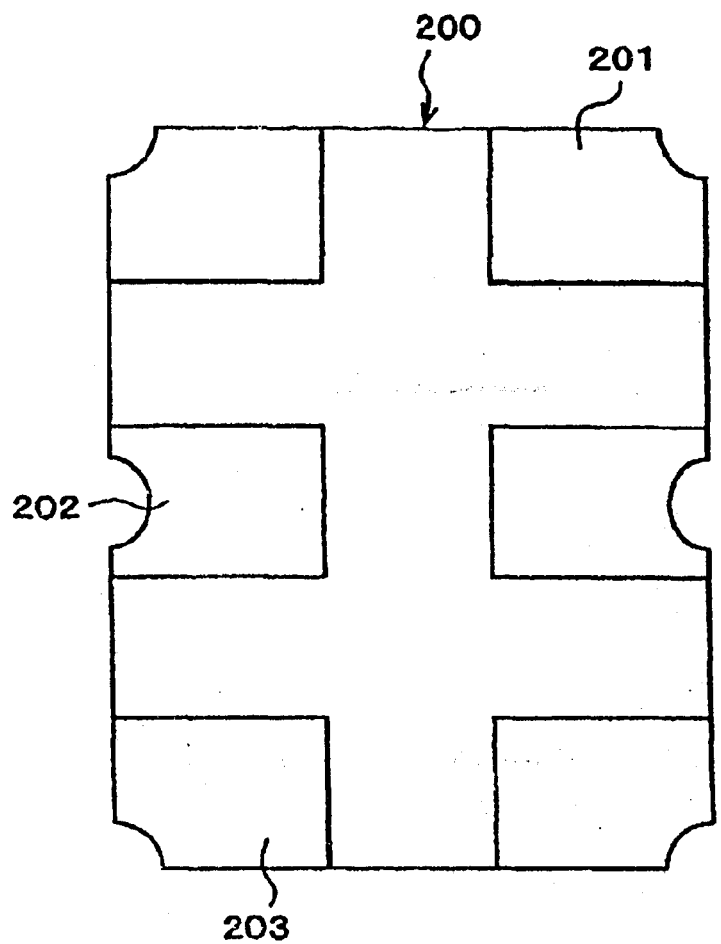
FIG. 19 is a plan view schematically illustrating the reverse surface of a package of the known SAW apparatus.
Figure 20:
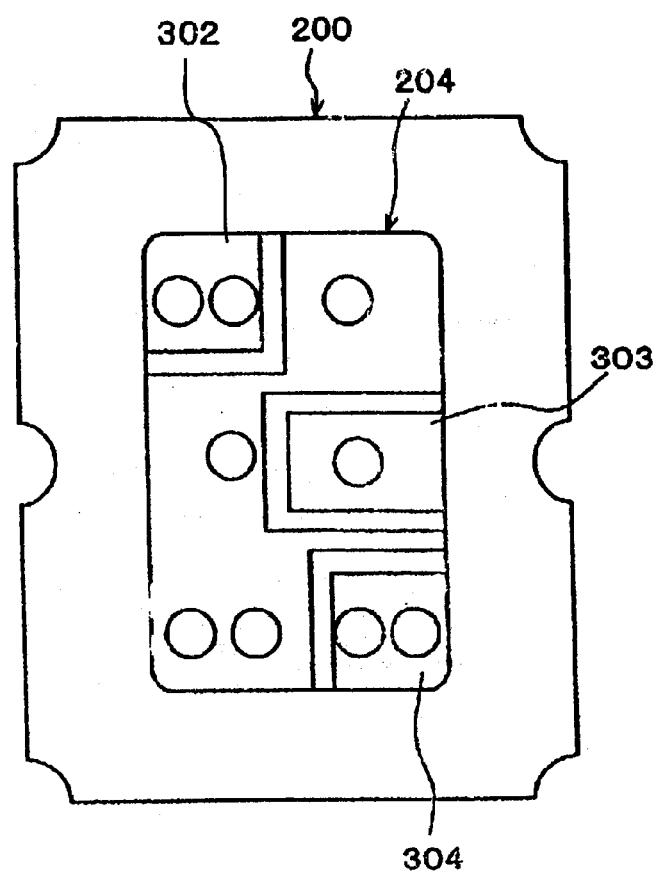
FIG. 20 is a plan view schematically illustrating the layout of a die attach portion in the package shown in FIG. 19.

A description is now given, with reference to FIG. 17, a communication apparatus including at least one of the SAW apparatuses of the first or second preferred embodiments according to a third preferred embodiment of the present invention. In a communication apparatus 600, as shown in FIG. 17, a receiver (Rx) includes an antenna 601, an antenna sharing portion/RF top filter 602, an amplifier 603, an Rx section filter 604, a mixer 605, a first IF filter 606, a mixer 607, a second IF filter 608, a first-and-second-signal local synthesizer 611, a temperature compensated crystal oscillator (TCXO) 612, a divider 613, and a local filter 614.

As indicated by two lines between the Rx section filter 604 and the mixer 605 shown in FIG. 17, two balanced signals are preferably transmitted from the Rx section filter 604 to the mixer 605 to maintain the balance characteristics.

In the communication apparatus 600, a transmitter (Tx) includes the antenna 601, the antenna sharing portion/RF top filter 602, a Tx IF filter 621, a mixer 622, a Tx section filter 623, an amplifier 624, a coupler 625, an isolator 626, and an automatic power control (APC) device 627. The antenna 601 and the antenna sharing portion/RF top filter 602 are shared by the receiver (Rx) and the transmitter (Tx).

The SAW apparatus of the first or second preferred embodiment is used as the Rx section filter 604, the first IF filter 606, the Tx IF filter 621, and the Tx section filter 623.

The SAW apparatus of various preferred embodiments of the present invention is provided with not only a filtering function, but also a balun function, and exhibits excellent characteristics in which the amplitude balance degree and the phase balance degree between the balanced signals are greatly improved. Thus, according to the communication apparatus of the present invention provided with the composite SAW apparatus, the number of components is decreased, and accordingly, the size of the overall communication unit is greatly reduced. The transmission characteristics are also greatly improved.

While preferred embodiments of the present invention have been described above, it is to be understood that modifications and changes will be apparent to those skilled in the art within the scope and spirit of the present invention. The scope of the present invention, therefore, is to be determined solely by the following claims.

What is claimed is:

1. A surface acoustic wave apparatus comprising:
   a surface acoustic wave device provided on a piezoelectric substrate, said surface acoustic wave device including at least one interdigital electrode, and balanced signal terminals provided for at least an input side and an output side;
   a multi-layered retaining substrate including external terminals for connecting the balanced signal terminals to an external device, said multi-layered retaining substrate being provided to retain said surface acoustic wave device such that the at least one interdigital electrode faces a surface of said multi-layered retaining substrate; and
   an electrical circuit provided between layers of said multi-layered retaining substrate such that said electrical circuit is located between the balanced signal terminals and the external terminals so as to increase a balance degree between the balanced signal terminals.

2. A surface acoustic wave apparatus according to claim 1, further comprising a package for accommodating the surface acoustic wave device, wherein the external terminals are disposed substantially symmetrically with respect to a central portion of the package via said electrical circuit.

3. A surface acoustic wave apparatus according to claim 1, wherein said electrical circuit comprises an adjusting portion provided for at least one of the balanced signal terminals of said surface acoustic wave device to improve a signal propagation characteristic of the balanced signal terminal.

4. A surface acoustic wave apparatus according to claim 3, wherein said adjusting portion is defined by at least one of a delay line, a reactance component, and a resistance component.

5. A surface acoustic wave apparatus according to claim 3, wherein said electrical circuit comprises the adjusting portions for both the balanced signal terminals of said surface acoustic wave device.

6. A surface acoustic wave apparatus according to claim 5, wherein an adjusting degree of one of the adjusting portions for one of the balanced signal terminals is different from an adjusting degree of the other adjusting portion for the other balanced signal terminal.

7. A surface acoustic wave apparatus according to claim 1, wherein said surface acoustic wave device comprises a longitudinally-coupled resonator mode surface acoustic wave element having at least three interdigital electrodes.

8. A surface acoustic wave apparatus according to claim 1, wherein said surface acoustic wave device is constructed such that an electrical neutral point is not provided between the balanced signal terminals.

9. A communication apparatus comprising at least one surface acoustic wave apparatus set forth in claim 1.

10. A surface acoustic wave apparatus according to claim 1, wherein a die attach portion is provided on a top surface of an upper layer of said multi-layered retaining substrate to electrically connect the surface acoustic wave device to the electrical circuit.

11. A surface acoustic wave apparatus according to claim 10, wherein the surface acoustic wave device is electrically and mechanically connected to the die attach portion via bumps.

12. A surface acoustic wave apparatus according to claim 10, wherein the die attach portion is electrically and mechanically connected to the electrical circuit by via holes provided in the upper layer of the multi-layered retaining substrate.

13. A surface acoustic wave apparatus according to claim 7, wherein the longitudinally-coupled resonator mode surface acoustic wave element further includes at least two reflectors sandwiching the at least three interdigital electrodes.

14. A surface acoustic wave apparatus according to claim 1, wherein the external terminals are provided on a bottom surface of a bottom layer of the multi-layered retaining substrate.

15. A surface acoustic wave apparatus comprising:
   a surface acoustic wave device provided on a piezoelectric substrate, said surface acoustic wave device including at least one interdigital electrode, and two balanced signal terminals and an unbalanced signal terminal;
   a multi-layered retaining substrate defined by at least an top layer and a bottom layer and including external terminals for connecting the two balanced signal terminals and the unbalanced signal terminal to an external device, said multi-layered retaining substrate being arranged such that the at least one interdigital electrode faces a surface of said multi-layered retaining substrate; and
   a plurality of wiring patterns provided between the top and bottom layers of said multi-layered retaining substrate such that said plurality of wiring patterns are located between the two balanced signal terminals and the external terminals and between the unbalanced signal terminal and the external electrodes so as to increase a balance degree between the balanced signal terminals.

16. A surface acoustic wave apparatus according to claim 15, further comprising a package for accommodating the surface acoustic wave device, wherein the external terminals are disposed substantially symmetrically with respect to a central portion of the package via said plurality of wiring patterns.

17. A surface acoustic wave apparatus according to claim 15, wherein said plurality of wiring patterns comprises an adjusting portion provided for at least one of the balanced signal terminals of said surface acoustic wave device to improve a signal propagation characteristic of the balanced signal terminal.

18. A surface acoustic wave apparatus according to claim 17, wherein said adjusting portion is defined by at least one of a delay line, a reactance component, and a resistance component.

19. A surface acoustic wave apparatus according to claim 17, wherein said plurality of wiring patterns comprises the adjusting portions for both of the balanced signal terminals of said surface acoustic wave device.

20. A surface acoustic wave apparatus according to claim 19, wherein an adjusting degree of one of the adjusting portions for one of the balanced signal terminals is different from an adjusting degree of the other adjusting portion for the other balanced signal terminal.

* * * * *